United States Patent
Woo et al.

(10) Patent No.: US 11,417,788 B2
(45) Date of Patent: Aug. 16, 2022

(54) TYPE-II HIGH BANDGAP TUNNEL JUNCTIONS OF INP LATTICE CONSTANT FOR MULTIJUNCTION SOLAR CELLS

(75) Inventors: Robyn L. Woo, Santa Monica, CA (US); Daniel C. Law, Arcadia, CA (US); Joseph Charles Boisvert, Thousand Oaks, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 12/950,912

(22) Filed: Nov. 19, 2010

(65) Prior Publication Data

US 2012/0125392 A1    May 24, 2012

(51) Int. Cl.
| | |
|---|---|
| H01L 31/0693 | (2012.01) |
| H01L 31/0735 | (2012.01) |
| H01L 31/0304 | (2006.01) |
| H01L 31/0687 | (2012.01) |
| H01L 29/88 | (2006.01) |

(52) U.S. Cl.
CPC ...... *H01L 31/0693* (2013.01); *H01L 31/0304* (2013.01); *H01L 31/03046* (2013.01); *H01L 31/0687* (2013.01); *H01L 31/0735* (2013.01); *H01L 29/88* (2013.01); *Y02E 10/544* (2013.01)

(58) Field of Classification Search
CPC .......... H01L 31/0693; H01L 31/0304; H01L 31/03046; H01L 31/0687; H01L 31/0735; H01L 29/88
See application file for complete search history.

(56) References Cited

U.S. PATENT DOCUMENTS

| | | | |
|---|---|---|---|
| 4,667,059 A * | 5/1987 | Olson | 136/249 |
| 5,019,177 A * | 5/1991 | Wanlass | 136/249 |
| 5,079,601 A | 1/1992 | Esaki et al. | |
| 5,407,491 A | 4/1995 | Freundlich et al. | |
| 5,679,963 A * | 10/1997 | Klem et al. | 257/46 |
| 5,923,663 A | 7/1999 | Bontemps et al. | |
| 6,255,580 B1 | 7/2001 | Karam et al. | |
| 6,316,715 B1 | 11/2001 | King et al. | |
| 6,340,788 B1 * | 1/2002 | King | H01J 37/3023 136/255 |
| 6,586,669 B2 | 7/2003 | King et al. | |
| 7,122,733 B2 | 10/2006 | Narayanan et al. | |
| 2004/0051113 A1 * | 3/2004 | Chang et al. | 257/104 |
| 2004/0200523 A1 | 10/2004 | King et al. | |
| 2007/0194300 A1 | 8/2007 | Ibbetson et al. | |

(Continued)

FOREIGN PATENT DOCUMENTS

| | | |
|---|---|---|
| GB | 2 255 227 A | 10/1992 |
| GB | 2255227 A | 10/1992 |

OTHER PUBLICATIONS

Gu, Y., et al. "High-efficiency InP based four-junction solar cells." Lasers and Electro-Optics Society, 2003. LEOS 2003. The 16th Annual Meeting of the IEEE. vol. 2. IEEE, 2003.*

(Continued)

*Primary Examiner* — Shannon M Gardner
(74) *Attorney, Agent, or Firm* — MH2 Technology Law Group LLP

(57) ABSTRACT

A type-II tunnel junction is disclosed that includes a p-doped AlGaInAs tunnel layer and a n-doped InP tunnel layer. Solar cells are further disclosed that incorporate the high bandgap type-II tunnel junction between photovoltaic subcells.

17 Claims, 3 Drawing Sheets

(56) References Cited

U.S. PATENT DOCUMENTS

| | | | | |
|---|---|---|---|---|
| 2009/0065047 | A1* | 3/2009 | Fiorenza | H01L 31/078 136/255 |
| 2010/0229930 | A1* | 9/2010 | Fetzer | H01L 31/0687 136/255 |

OTHER PUBLICATIONS

Zolper, John C., et al., GaAsSb-Based Heterojunction Tunnel Diodes for Tandem Solar Cell Interconnects, 1994 IEEE, First WCPEC; Dec. 5-9, 1994; Hawaii, pp. 1843-1846.

Gu, Y et al., "High-efficiency InP based four-junction solar cells", Annual Meeting of the IEEE Lasers and Electro-Optics Society, Oct. 2003, pp. 927-928, vol. 2.

Jung et al., AlGaAs/GaInP heterojunction tunnel diode for cascade solar cell application, Journal of Applied Physics, 74, 2090 (1993), 5 pages.

King et al., "Band-Gap-Engineered Architectures for High-Efficiency Multijunction Concentrator Solar Cells," presented at the 24th European Photovoltaic Solar Energy Conference and Exhibition, Hamburg, German, Sep. 21-25, 2009, 7 pages.

Law et al., "Semiconductor-Bonded III-V Multijunction Space Solar Cells," Boeing—Spectrolab, Inc., date unknown, 3 pages, Published Jun. 2009.

King et al., "40% efficient metamorphic GaInP/GaInAs/Ge multijunction solar cells," Applied Physics Letters, 90, 183516 (2007), 3 pages.

Suzuki et al., "Low resistance tunnel junctions with type-II heterostructures," Applied Physics Letters, 88, 231103 (2006) 3 pages.

Examination Report dated Aug. 28, 2018 in corresponding European Application No. 11 764 066.4, 9 pages.

Gu, "Design, Fabrication and Characterization of Hetero-PN-junction Devices for Photovoltaic and Photodetection Applications" Dissertation (2008), 209 pages.

Notice of Final Rejection dated Jul. 30, 2018 in corresponding Korean Application No. 10-2013-7006454.

Notification of First Office Action dated Jan. 28, 2019 in corresponding Chinese Application No. 201710803810.4.

Notification of Second Office Action dated Aug. 20, 2019 in corresponding Chinese Application No. 201710803810.4 (English translation also provided).

Communication pursuant to Article 94(3) EPC dated Apr. 15, 2020 in corresponding European Application No. 11764664.4, 7 pages.

Notification of the Decision of Rejection dated Dec. 3, 2019 in corresponding Chinese Application No. 201710803810.4 (English translation also provided), 19 pages.

GU el al., "High-Efficiency InP Based Four-Junction Solar Cells," IEEE, Oct. 26, 2003, pp. 927-928.

Translation of Office Action dated Jan. 26, 2018 in corresponding Korean Application No. 10-2013-7006454.

Office Action dated Jun. 5, 2017 in corresponding Canadian Application No. 2,810,895.

* cited by examiner

TYPE-II HIGH BANDGAP TUNNEL JUNCTIONS OF InP LATTICE CONSTANT FOR MULTIJUNCTION SOLAR CELLS

This disclosure was made with Government support under Contract No. FA9453-09-C-0373 awarded by Air Force Research Laboratory. The Government has certain rights in this disclosure.

FIELD

The present disclosure generally relates to photovoltaic cells and, more specifically, to solar cells of InP lattice constant having high bandgap, type-II tunnel junctions.

BACKGROUND

A solar cell is a device that is capable of converting sunlight energy to electricity by photovoltaic effect. A solar cell can have one or more photovoltaic subcells or p-n junctions. A multijunction solar cell has more than one photovoltaic subcells that are monolithically connected in series.

The interest in solar cells has been increasing due to concerns regarding pollution and limited available resources. This interest has been for both terrestrial and space applications. In space applications, solar cells have been in use for more than 40 years and the development of higher efficiency solar cells enables increased payload capabilities.

The relatively high cost per watt of electrical power generated by photovoltaic systems inhibits their widespread use in terrestrial applications. The conversion efficiency of sunlight to electricity may be critically important for terrestrial PV systems, since increased efficiency usually results in a reduction of related electricity generation system components (such as cell area, module or collector area, support structures, and land area) for a required power output of the system. For example, in concentrator solar cell systems which concentrate sunlight from around 2 to around 2000 times onto the solar cell, an increase in cell efficiency typically results in a reduction of an area comprising expensive solar cells and concentrating optics. Improvements in solar cell efficiency are extremely leveraging at the system level, and the dollar per watt ($/watt) is a typical figure-of-merit applied at the system level. For satellites, solar panels represent <10% of the entire system cost so that a relative improvement in solar cell efficiency of 3% over an existing technology generation results in cost savings. The same is true of terrestrial concentrator solar power systems where the cost of the solar receiver is a small fraction of the overall system cost.

To increase the electrical power output of such solar cells, multiple subcells or layers having different energy bandgaps have been stacked so that each subcell or layer can absorb a different part of the wide energy distribution in the sunlight. This arrangement is advantageous, since each photon absorbed in a subcell corresponds to one unit of charge that is collected at the subcell operating voltage, which is approximately linearly dependent upon the band gap of the semiconductor material of the subcell. Since the output power is the product of voltage and current, an ideally efficient solar cell would have a large number of subcells, each absorbing only photons of energy negligibly greater than its band gap.

Lattice constants of compounds and alloys used to form photovoltaic cells are well known. When such materials are combined into devices having subcells of different materials, it is important that the lattice of the different materials have the same lattice constants to within a small difference. This avoids the formation of imperfections in the crystalline structures that can drastically lower the efficiency of the devices. When the term lattice-matched is used herein, it denotes a difference in lattice constants of the materials of not more than about 0.3 percent. Preferably, lattice constants are matched to within about 0.2 percent or less.

In any multijunction device, electrical connection must be made between the subcells. Preferably, these intercell ohmic contacts (IOCs) should cause very low loss of transmitted light between cells. Therefore, these contacts should have maximum optical transparency and minimal electrical resistance. There are two methods known for making such IOCs, metal interconnects and tunnel junctions (or tunnel diodes). Metal interconnects can provide low electrical resistance, but they are poor in optical transparency and difficult to fabricate. Complex processing of metal interconnects results in substantial loss in the device efficiency and reliability. Therefore, tunnel junctions are much preferred. A monolithic integrated device can be produced having a plurality of subcells with tunnel junctions therebetween. But the tunnel junctions must satisfy multiple requirements, such as low resistivity, low optical losses, and crystallographic compatibility through lattice-matching between contacting subcells. Most importantly, they must exhibit a high peak current density.

One type of tunnel junction that has been used in multijunction solar cells lattice-matched to InP lattice constant is a highly doped AlGaInAs homojunction based tunnel diode. A homojunction is a semiconductor interface that is between two similar layers that have the same bandgap, but different type of doping, in this case, the interface between a n-doped AlGaInAs and a p-doped AlGaInAs layers.

FIG. 1 illustrates a prior art InP-based dual-junction solar cell 100, hereinafter referred to as the "prior art cell" 100. As can be seen in FIG. 1, the prior art cell 100 includes a first subcell 102 and a second subcell 104. The first subcell 102 includes a first GaInPAs emitter and base 120. The first subcell 102 further includes a window layer 110 deposited atop the first GaInPAs emitter and base 120, and a p-doped InP back-surface field (BSF) layer 130 disposed on the opposite side (or bottom) of the first GaInPAs emitter and base 120. The second subcell 104 includes a second GaInPAs emitter and base 170, having a n-doped InP window 160 disposed a top thereof, and a BSF layer 180 disposed on the opposite side (or bottom) thereof. The first and second GaInPAs emitter and base, 120, 170 have bandgap energies of 1.1 electron volts (eV) and 0.8 eV, respectively. Between the first and second subcells 102, 104, is an AlGaInAs homojunction based tunnel diode 190. The AlGaInAs homojunction based tunnel junction 190 includes a n-doped AlGaInAs tunnel layer 150 and a p-doped AlGaInAs tunnel layer 140.

Other types of tunnel junctions that have been used in multijunction solar cell lattice-matched to InP lattice constant include type-II, low bandgap GaInAs/GaAsSb tunnel diodes, lattice-mismatched AlGaInAs/AlGaAs, and lattice-mismatched AlGaInAs/GaAs tunnel diodes. However, the low bandgap, type-II tunnel junction reduces the amount of light available to the second subcell leading to lower conversion efficiency. Additionally, the arsenide-based, lattice-mismatched AlGaInAs/AlGaAs and AlGaInAs/GaAs tunnel-diodes involve lattice-mismatch material and may require strain balancing, which add complications during growth and often degrade the performance of the photovoltaic subcells. Furthermore, the repeatability of the lattice-mismatched material approaches has been poor and maintaining good material quality has been difficult.

There exists a need for a tunnel junction of InP lattice constant that provides for improved peak tunneling current with low optical and electrical losses. Such tunnel junctions enable multijunction solar cells to operate at higher solar intensity without compromising overall device performance that can leads to higher power conversion efficiency.

SUMMARY

The present disclosure provides an improved type-II, high bandgap tunnel junction of InP lattice constant for solar (photovoltaic) cell that is most preferably utilized in a multijunction structure. The disclosed type-II, high bandgap tunnel junction enables solar cells to achieve increased efficiency and performance, with little change in cost, as compared with conventional solar cells.

In accordance with the disclosure, a high bandgap, type-II tunnel junction is disclosed that includes a p-doped AlGaInAs tunnel layer and a n-doped InP tunnel layer.

In accordance with the disclosure, a multijunction solar cell of InP lattice constant is disclosed that includes a high-bandgap, type-II tunnel junction. The high bandgap type-II tunnel junction includes a p-doped AlGaInAs tunnel layer, and a n-doped InP tunnel layer. Another implementation of the disclosure is directed to a photonic device, comprising: a first photovoltaic cell, a second photovoltaic cell and a high bandgap, type-II tunnel junction. The first photovoltaic cell is disposed on a first side of the type-II tunnel junction and the second photovoltaic cell is disposed on a second side of the type-II tunnel junction. The first photovoltaic cell and the second photovoltaic cell each comprise a layer of semiconductor material selected from the group consisting of InP, AlInAs, AlAsSb, AlInAsSb, AlInPAs, AlGaInAs, GaInPAs, GaInAs, AlGaAsSb, GaAsSb and their combinations. The type-II tunnel junction comprises: a p-doped tunnel layer; and a n-doped tunnel layer. The high bandgap, type-II tunnel junction has an InP lattice constant.

In accordance with the disclosure, a method of forming a tunnel junction is disclosed that includes growing AlGaInAs and InP doped tunnel layers in a Metal Organic Vapor Phase Epitaxial (MOVPE) reactor to form a type-II high bandgap tunnel junction.

One advantage of the present disclosure is providing for a tunnel junction having increased tunneling current through the p-n junction.

Another advantage of the present disclosure is providing for a tunnel junction having a narrower space charge region, increasing the tunneling probability and increasing the peak tunneling current of the tunnel-diode for handling higher solar intensity.

Another advantage of the present disclosure is providing for a tunnel junction having an improved material growth process.

Another advantage of the present disclosure is providing for a tunnel junction having a higher bandgap than existing homojunction-based tunnel diode and type II GaAsSb/GaInAs tunnel junctions.

Another advantage of the present disclosure is providing for a tunnel junction having higher optical transparency (λ>920 nm) than existing tunnel junctions, thus reducing optical parasitic loss.

Another advantage of the present disclosure is providing for a single bandgap binary semiconductor layer acting as both a window, a BSF, and a tunnel junction layer by changing the corresponding doping polarity and doping levels. This reduces the complexity of the cell structure design and the corresponding MOVPE growth process.

Other features and advantages of the present disclosure will be apparent from the following more detailed description of the preferred embodiment, taken in conjunction with the accompanying drawings, which illustrate, by way of example, the principles of the disclosure. The scope of the disclosure is not, however, limited to this preferred embodiment.

BRIEF DESCRIPTION OF THE DRAWINGS

Wherever possible, the same reference numbers will be used throughout the drawings to represent the same parts.

DETAILED DESCRIPTION

Figure 1:
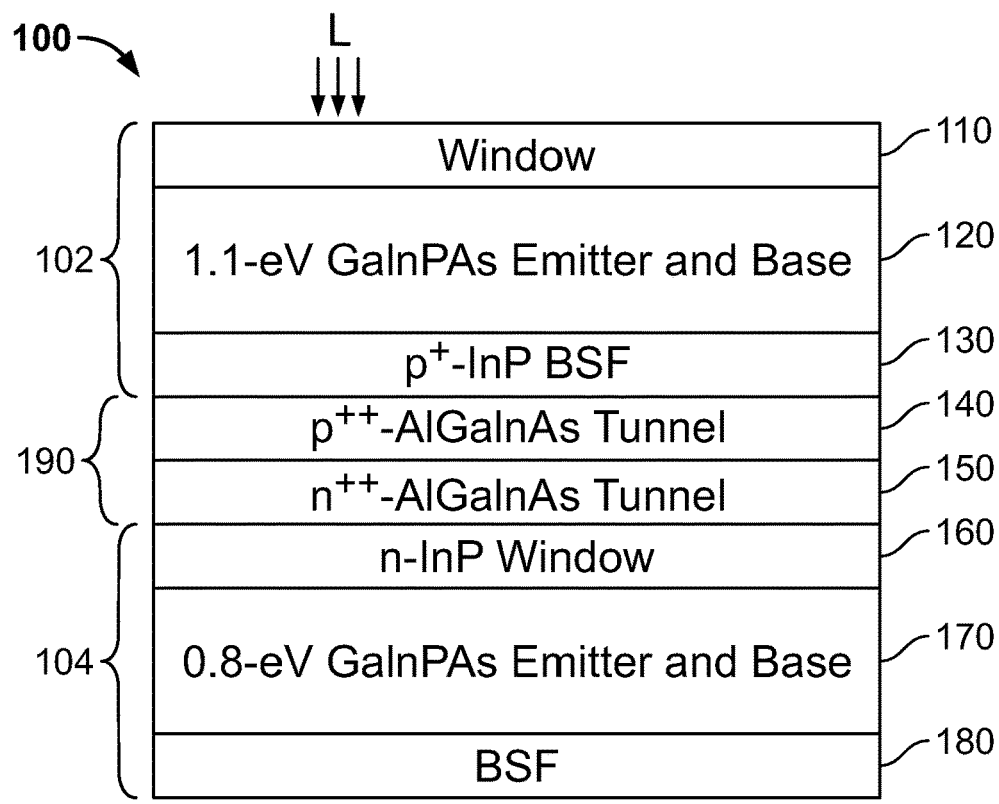
FIG. 1 illustrates a prior art InP-based dual-junction solar cell.
Figure 2:
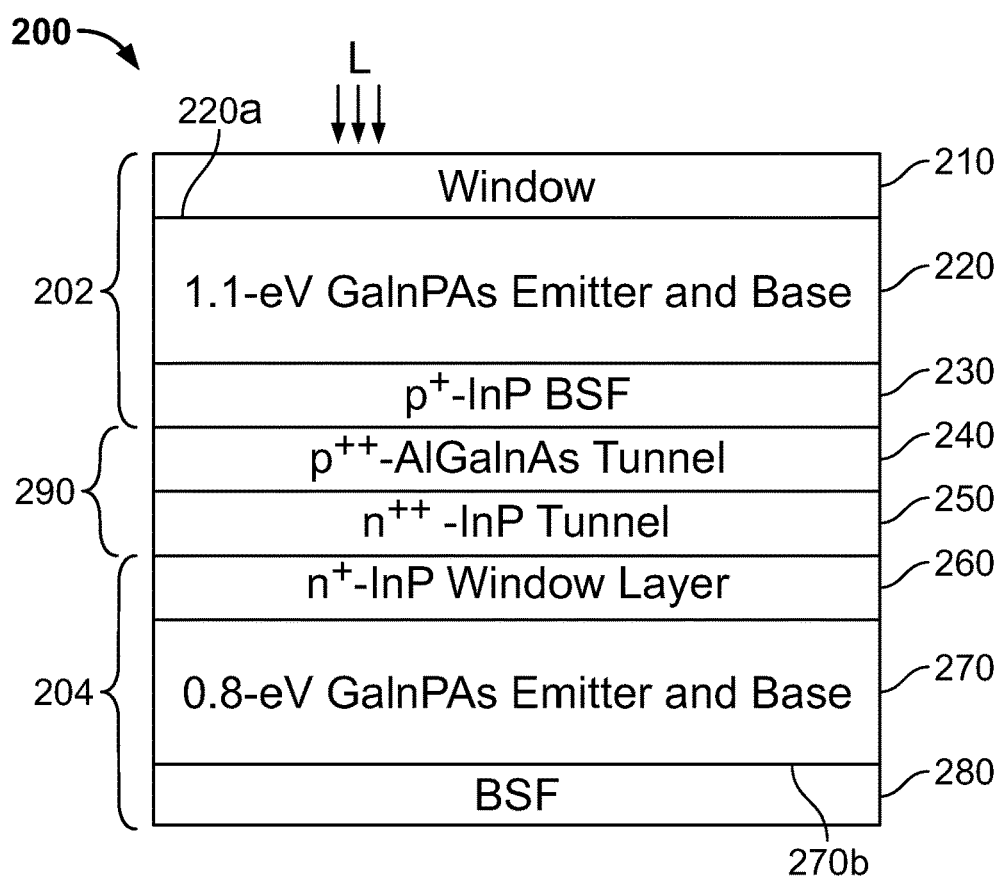
FIG. 2 illustrates an exemplary embodiment of a solar cell according to the disclosure.

FIG. 2 illustrates a device 200 according to an embodiment of the disclosure. The device 200 is a photonic device. In this embodiment, the device 200 is a solar cell. In another embodiment, the device 200 may be a multijunction solar cell. In another embodiment, the device 200 may be other photonic devices such as laser power converter or sensors for converting light to electricity. Both solar cells, which convert a broad spectrum of light power to electrical power, as well as laser power converters which convert light at a single wavelength to electrical power, are examples of photonic devices that benefit from improved tunnel junction performance.

As can be seen in FIG. 2, the device 200 is an InP-based dual-junction solar cell, meaning it includes two photovoltaic cells. The individual photovoltaic cells may be referred to as subcells. The device 200 includes a first photovoltaic cell 202 and a second photovoltaic cell 204. The first photovoltaic cell 202 includes a first emitter and base 220. In this exemplary embodiment, the first emitter and base 220 is a GaInPAs emitter and base having an InP lattice constant. In another embodiment, the first emitter and base 220 may be III-V material such as, but not limited to AlAsSb, AlGaAsSb, AlInAs, InP, AlGaInAs, GaInAs, GaAsSb or GaInPAs with different bandgaps having lattice constant same as InP. In one embodiment, the first emitter and base 220 includes a separate emitter layer and base layer (not shown), the emitter layer being nearest incident light.

The first photovoltaic cell 202 has a bandgap of 1.1 eV. In another embodiment, the first photovoltaic cell 202 may have a bandgap of from about 0.73 to 2.45 eV. In another embodiment, the first photovoltaic cell 202 may have a bandgap of from about 1.0 to 1.1 eV. In yet another embodiment, the first photovoltaic cell 202 may have a bandgap of from about 1.0 to 1.1 eV and may be included in a three or more junction solar cell. The first photovoltaic cell 202 is sensitive to a first-photoactive-subcell-layer wavelength. As used herein, "wavelength" may mean a single discrete wavelength, or, "wavelength" may include a range of wavelengths at which the layer material achieves a good light-to-electricity conversion efficiency.

The first photovoltaic cell 202 further includes a window layer 210. The window layer 210 is disposed on a first side 220a of the first emitter and base 220, which would be positioned nearest to incident light, which is represented by arrow L. As used herein, the relative terms "top" and "bottom" are used to indicate the surface nearest to and farthest from incident light, respectively. Also, when used to compare two layers, "upper" or "above" or "overlying" refers to a layer closer to the sun, and "lower" or "below" or "underlying" refers to a layer further from the sun or other source of illumination. The window layer 210 may be InP, AlGaInAs, AlInAs, AlAsSb, AlGaAsSb, GaInPAs composition that provides bandgap energy greater than about 1.1 eV. The window layer 210 has two functions. The first function of the window layer 210 is to reduce minority-carrier recombination (i.e., to passivate) on the front surface 220a of the first photovoltaic subcell 202. Additionally, the optical properties of the window material must be such that as much light as possible is transmitted to the first photoactive subcell 202, and any additional photoactive subcell layers that may be disposed underneath thereof (not shown), where the photogenerated charge carriers can be collected more efficiently. If there is substantial light absorption in the window layer 210, carriers generated in the window layer are less likely to be subsequently collected and hence light absorption in the window degrades overall conversion efficiency.

The device 200 may optionally include an antireflection (AR) layer or coating (not shown) disposed on top of the device 200 nearest incident light L, which is shown impinging from the direction indicated by the arrows. In one embodiment, the AR coating may be disposed atop the window layer 210. The AR coating is intended to minimize surface reflections between the optically transparent media above the cell (such as air, glass, or polymer) and the semiconductor layers of the device 200, thereby enabling more photons to enter the device 200. The AR coating may be made from well-known materials in the art, such as $TiO_2$, $Ta_2O_5$, $SiO_2$, and $MgF_2$. The thickness of the AR coating may vary, but is typically between about 0.04 and 0.35 microns. While an AR coating can be applied to device 200, in other configurations another subcell can be stacked or applied above the device 200 with another tunnel junction therebetween.

The first photovoltaic cell 202 further includes a p-doped BSF layer 230 disposed on the bottom of first emitter and base 220. In this exemplary embodiment, the p-doped BSF layer 230 is a p-doped InP BSF layer. In another embodiment, the p-doped BSF layer 230 may be AlGaInAs, GaAsSb, AlAsSb, AlGaAsSb, AlInAs, GaInPAs and their alloys layer. In one embodiment, the BSF layer 230 is lattice-matched to InP. In another embodiment, the BSF layer 230 may be a coherently strained layer with a thickness below the Matthews-Blakeslee thickness. The p-doped BSF layer 230 reduces minority-carrier recombination at the back surface of the first emitter and base 220. The p-doped BSF layer 230 has optical properties that allow light that can be used by subcells beneath the p-doped BSF layer 230 to be transmitted through the p-doped BSF layer 230, and/or the minority-carrier properties in the p-doped BSF layer 230 must be such that electrons and holes that are generated by light absorption in the p-doped BSF layer 230 are efficiently collected at the p-n junction of the device 200. Minority carrier electrons are collected at the p-n junction 290 of first emitter and base 220. The p-doping in the BSF layer 230 and first emitter and base 220 are typically graded from highest concentration at the BSF layer 230 to lowest concentration at a base layer (not shown) of the first emitter and base 220 to create an electric field that sweeps electrons from the BSF layer 230 towards the emitter and base 220.

The second photovoltaic cell 204 includes a second emitter and base 270. In this exemplary embodiment, the second emitter and base 270 is a GaInPAs layer having an InP lattice constant. In another embodiment, the second emitter and base 270 may be GaInAs, GaAsSb, AlGaInAs, AlGaAsSb, GaInPAs and their alloys having an InP lattice constant. The second emitter and base 270 has a bandgap lower than the bandgap of the first emitter and base 220.

In this exemplary embodiment, the second photovoltaic cell 204 has a bandgap of about 0.8 eV. In another embodiment, the second photovoltaic cell 204 may have a bandgap of from about 0.73 to 2.0 eV. In another embodiment, the second photovoltaic cell 204 may have a bandgap of from about 0.73 to 0.8 eV. In yet another embodiment, the second photovoltaic cell 204 may have a bandgap of from about 0.73 to 0.8 eV and be included in a three or more junction solar cell lattice matched to InP.

The second photovoltaic cell 204 further includes an n-doped window layer 260 disposed on top of the second emitter and base 270. The general characteristics of the n-doped window layer 260 is similar to the window characteristics of the window layer 210. The n-doped window 260 has an n-doping concentration of between about $2\times10^{18}/cm^3$ and $2\times10^{19}/cm^3$. In another embodiment, the n-doped window 260 has a n-doping concentration of about $1\times10^{19}/cm^3$ to create a large electric field and passivated the p-n junction 270.

The second photovoltaic cell 204 further includes a second back-surface field (BSF) layer 280 below the second emitter and base 270. In one embodiment, the second BSF layer 280 may be an InP, AlGaInAs, AlAsSb, GaAsSb, AlGaAsSb, or GaInPAs wider bandgap layer. In one embodiment, the second BSF layer 280 is lattice-matched to InP. In another embodiment, the BSF layer 280 may be a coherently strained layer with a thickness below the Matthews-Blakeslee thickness. The second BSF layer 280 provides a passivation function similar to the window layer 210, and has BSF characteristics similar to those of the p-doped InP BSF layer 230. As such, the second BSF layer 280 reduces minority-carrier recombination at the back surface 270b of the second emitter and base 270. The second BSF layer 280 must also have optical properties that allow most of the light that can be used by any subcells beneath the second BSF layer to be transmitted through the second BSF layer, and/or the minority-carrier properties in the second BSF layer 280 must be such that electrons and holes which are generated by light absorption in the second BSF layer 280 are efficiently collected in the cell 204.

The device 200 further includes a highly doped, high band-gap, type-II tunnel junction, which may be referred to as tunnel junction or p-n junction 290. The p-n junction has an InP lattice constant connecting the first photovoltaic cell 202 and the second photovoltaic cell 204 in electrical series. The type-II indicates that more favorable band alignment is provided that charged particles can tunnel through the p-n junction with less energy. This results in a narrower space charge region increasing the tunneling probability and increasing the peak tunneling current of the tunnel-diode for handling higher solar intensity. The purpose of doping the p-n junction 290 at high levels is to reduce the resistance for charged carriers to tunnel through the p-n junction 290.

The p-n junction 290 includes a highly p-doped tunnel layer 240 and a highly n-doped tunnel layer 250. The highly p-doped tunnel layer 240 is lattice matched to InP. The doping level ranges from $1\times10^{19}/cm^3$ to $1\times10^{20}/cm^3$ for these tunnel layers. In one embodiment, the n-doped InP tunnel layer 250 may serve as tunnel layer for tunnel diode as well as a window layer for subcell underneath the tunnel diode.

In an embodiment, the highly p-doped tunnel layer 240 may be a highly p-doped Al(Ga)InAs tunnel layer. In another embodiment, the highly p-doped tunnel layer 240 is AlxGa1-xInAs with x>0.25 or x=1. The highly p-doped tunnel layer 240 has a bandgap of greater than or equal to 1.25 eV. In one embodiment, the highly p-doped tunnel layer 240 has a bandgap greater than 1.25 eV. In another embodiment, the highly p-doped tunnel layer 240 has a bandgap of 1.45 eV.

The highly n-doped tunnel layer 250 is lattice matched to InP. In an embodiment, the highly n-doped tunnel layer 250 is high bandgap III-V semiconductor having a InP lattice constant and that can form type II band alignment with the p-doped tunnel layer. In another embodiment, the highly n-doped tunnel layer is a highly n-doped InP, AlInPAs, AlAsSb, or AlGaAsSb tunnel layer having a bandgap greater than or equal to 1.35 eV and an InP lattice constant. In one embodiment, the highly n-doped InP tunnel layer 250 is an InP tunnel layer having a bandgap of 1.35 eV.

The bandgap of the highly p-doped tunnel layer 240 must be equal to or greater than 1.25 eV to form a type-II staggered tunnel junction with the highly n-doped tunnel layer 250. For a higher bandgap, n-doped tunnel layer of AlInPAs, a p-doped tunnel layer of AlInAs may be used. The bandgap difference or Al-composition difference must be maintained to form a type-II staggered tunnel diode.

The solar cell 200 may further include a substrate (not shown) beneath the BSF layer 280. In one embodiment, the substrate may be InP. In another embodiment, the substrate may be silicon, GaSb, CdTe, InP/Si template or InGaAs/Si template or other semiconductor. In an embodiment, the substrate may be single side polished or double side polished. In an embodiment, the substrate may have a surface orientation of (100) and thickness of 300-1000 μm or beyond. In an embodiment, the substrate may be doped either n-type or p-type. In an embodiment, the substrate is doped p-type. In one embodiment, the substrate may be doped to greater than $5\times10^{18}/cm^3$ to enable ohmic contact to a metal contact layer.

Window layer 210 may have a heavily doped n-type cap layer above it that is patterned using standard photolithographic techniques. This pattern is designed to leave large areas of the window layer open to incident light. This cap layer may have a metal contact layer patterned to make contact to only the cap layer, leaving large areas of the window open to incident light. The metal contact layer enables ohmic contact to be made to the solar cell for subsequent assembly into a power providing electrical circuit.

The p-n junction 290 provides improved optical transparency and improved peak tunneling current in the tunnel junction of device 200 without compromising overall device performance, which leads to higher power conversion efficiency at higher solar intensity. The p-n junction is capable of performing at higher solar intensity, consequently improving higher solar energy conversion efficiency.

The AlGaInAs and InP doped tunnel layers 240, 250 are grown sequentially in a Metalorganic Vapor Phase Epitaxy (MOVPE) reactor to form the p-n junction 290, in this case a tunnel junction diode. Furthermore, the device 200 and device components (window, BSF) are be grown in a MOVPE reactor. In another embodiment, the p-n junction 290 may be grown in a Metalorganic Vapor Phase Epitaxy (MOVPE), Molecular Beam Epitaxy (MBE), Chemical Beam Epitaxy (CBE), Hydride Vapor Phase Epitaxy (HVPE) or Atomic Layer Deposition (ALD) reactor.

The device 200 shown in FIG. 2 is an upright solar cell configuration, or in other words, the device 200 is grown with new layers above the prior layer and with the highest bandgap cell of multi junction cells last. In another embodiment, the device 200 may be inverted or with the highest bandgap cell of multi junction cells grown first. The growth sequence changes depending on upright or inverted configuration, however for testing and field operations, the highest bandgap cell is sitting closest to the sun. In an embodiment, the device 200 may be an inverted InP-based multijunction cell with a high bandgap, type-II tunnel junction. According to the disclosure, a p-doped tunnel layer is always between a p-doped BSF layer and n-doped tunnel layer and n-doped tunnel layer is between p-doped tunnel layer and n-doped window layer.

According to the present disclosure, the bandgap of the material (AlGaInAs/InP) in the tunnel junction 290 is higher than existing solutions, for example when compared to a tunnel junction of GaInAs/GaAsSb having a bandgap of 0.73/0.77 eV respectively, which allows higher optical transparency for lower parasitic loss. The present disclosure provides for a p-n junction 290 having a bandgap of AlGaInAs of 1.25 eV and bandgap of InP is 1.35 eV, as compared to an AlGaInAs homojunction based tunnel diode of the prior art having bandgap of 1.25 eV across the diode. In one embodiment, the bandgap of the tunnel junction 290 ranges from 0.73 eV to 2.0 eV, lattice matched to InP lattice constants. In another embodiment, the band gap of the tunnel junction 290 is greater than 1.25 eV. In one embodiment, the tunnel junction 290 has a greater optical transparency (λ) than existing solutions.

Other embodiments utilizing even higher bandgap semiconductor alloys, e.g. AlInAs, AlAsSb, and AlInPAs may have even greater optical transparency for an extended wavelength range. The band offset of the material used (such as, AlGaInAs/InP) in the tunnel junction 290 forms a type II heterostructures tunnel junction diode that reduces the amount of energy required for charged particles to tunnel through the p-n junction. This results in a narrower space charge region increasing the tunneling probability and increasing the peak tunneling current of the tunnel-diode for handling higher solar intensity.

A heterojunction based tunnel diode places an alloy layer in a region of the device (the n-region of a p-n junction) that forms Type-II band alignment with the p-region of a tunnel junction. In general, the tunneling probability can be approximated by the following equation:

$$T_t \approx \exp\left(-\frac{4w\sqrt{2mE_g}}{3\hbar}\right) \quad \text{(Equation A)}$$

Where $E_g$ is the bandgap of the junction semiconductor layer and w is the depletion width of the p-n junction.

Figure 3:
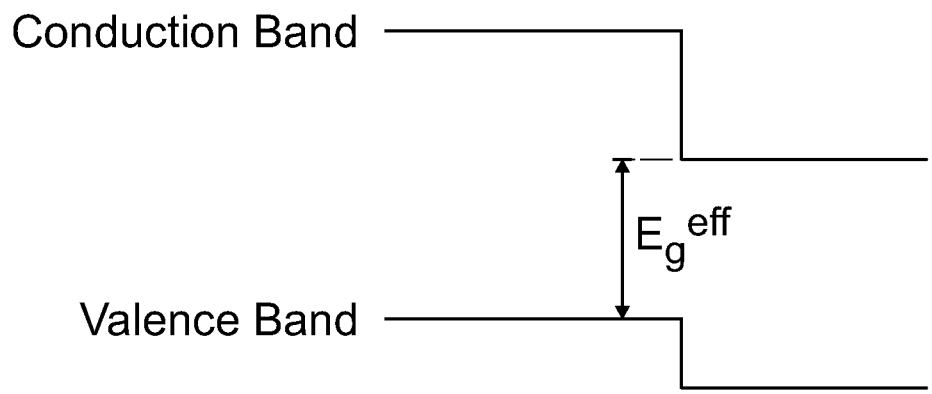
FIG. 3 illustrates the staggered bandgap alignment of n-doped InP layer and p-doped AlGaInAs layers of a type II heterojunction as formed by the tunnel junction of the present disclosure.

The equation indicates that tunneling probability increases as the bandgap of the junction decreases. In a type II heterojunction as formed by the p-n junction 290, the bandgap of n-doped layer and p-doped layer staggers as shown in FIG. 3. This band alignment reduces $E_g$ to $E_g^{\mathit{eff}}$, the energy gap to be between the valance band edge of the p-side and the conduction band edge of the n-side at the heterojunction interface. Since $E_g^{\mathit{eff}}$ is smaller than $E_g$ of the homojunction, the tunneling probability of the type II tunnel junction does get higher than that of the homojunction.

The p-n junction 290, which may be referred to as high bandgap, type-II tunnel junction diode, may monolithically integrate photovoltaic subcells formed of InP, AlInAs, AlInAsP, AlAsSb, AlInAsSb, AlGaAsSb, AlGaInAs, GaInPAs, GaInAs, GaAsSb and their combination into a multijunction solar cell of InP lattice constant. In one embodiment, the high bandgap (e.g. AlGaInAs/InP) type-II tunnel junction diode may enable a single junction solar cell to be grown onto a substrate of opposite polarity than the first layer (such as p-type BSF or n-type window) of the intended devices for use in a space or terrestrial applications.

In addition, the AlGaInAs/InP type-II tunnel junction diode may enable the fabrication of ultra-high efficiency (>33%) direct-semiconductor bonded multijunction solar cells, Carbon NanoTube-bonded (CNT-bonded) multijunction solar cells, and multijunction solar cells with component subcells at the InP lattice-constant. For example, low bandgap (~0.7-1.2-eV) component subcells at the InP lattice constant are becoming one of the key component in the ultra-high efficiency (>33%) multijunction solar cell structure.

In another embodiment, the AlGaInAs/InP type-II tunnel junction diode may be used in a multijunction solar cell, resulting in a solar cell of desirable bandgap combinations with higher performance due to the higher peak tunneling current and lower parasitic optical loss.

Figure 4:
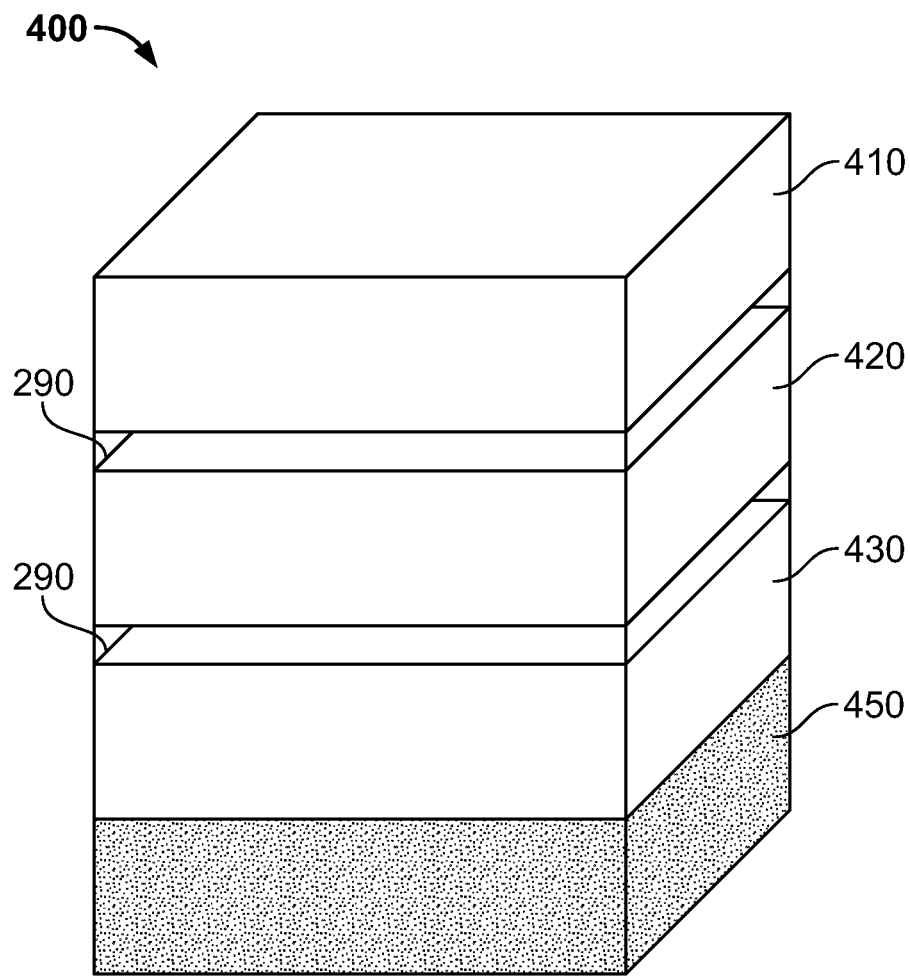
FIG. 4 illustrates an InP-based triple junction solar cell using high bandgap, Type-II tunnel junctions according to the present disclosure.

FIG. 4 illustrates an embodiment of a multijunction photovoltaic device 400. The photovoltaic device 400 may be a multijunction solar cell. As can be seen in FIG. 4, a multijunction solar cell 400 is shown that includes a first photovoltaic cell 410, a second photovoltaic cell 420, and a third photovoltaic cell 430. Disposed between the adjacent cells are p-n junctions 290 as described above.

The multijunction solar cell 400 further includes a substrate 450. In this exemplary embodiment, the substrate 450 is an InP substrate. In another embodiment, the substrate 450 may be InP layer or III-V semiconductor layer with an InP lattice constant transferred onto virtual substrates, such as hybrid templates in a combination of InP or GaInAs with Si, Ge, GaAs, InAs, GaP, GaSb, polymer, metal substrate. Furthermore, the multijunction solar cell 400 may further include window and BSF layers as described above.

Figure 5:
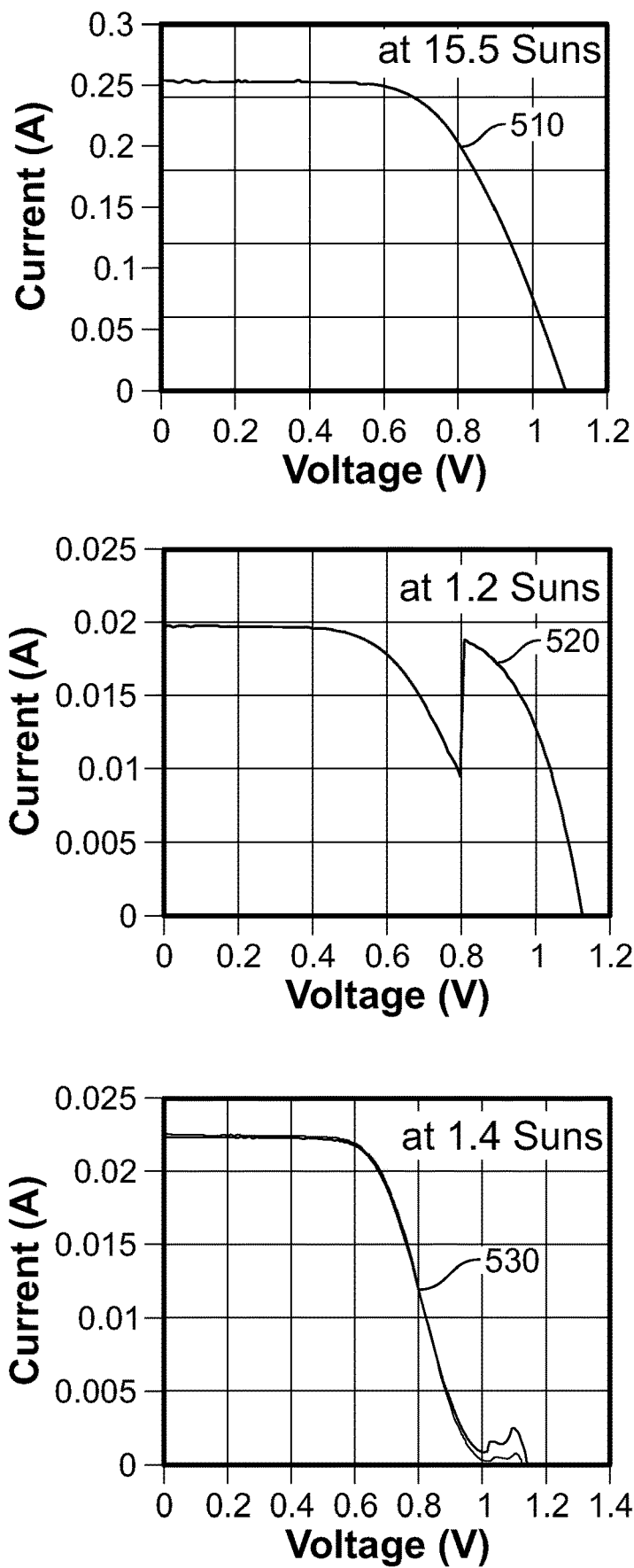
FIG. 5 shows a chart of the relationship between current and voltage of a multijunction solar cell of the present disclosure at 15.5 suns compared to prior art multijunction solar cells at 1.2 and 1.4 suns.

FIG. 5 shows a current and voltage function (IV curve) of a multijunction solar cell according to the present disclosure at 15.5 suns compared to current and voltage functions of two exemplary prior art multijunction solar cells at 1.2 and 1.4 suns using homojunction AlGaInAs/AlGaInAs tunnel diode. As can be seen in FIG. 5, the solar cell using a type II tunnel diode as described in this disclosure provides an IV curve functioning as intended at 15.5 suns, and having a peak tunneling current exceeding the current required to operate the solar cell, which is capable of handling current density of 0.25 A/cm$^2$ at this concentration.

Although a particular embodiment of the disclosure has been described in detail for purposes of illustration, various modifications and enhancements may be made without departing from the spirit and scope of the disclosure. Accordingly, the disclosure is not to be limited except as by the appended claims.

What is claimed is:

1. A tunnel junction of a solar cell, the tunnel junction comprising:
   a p-doped tunnel layer comprising AlGaInAs; and
   a n-doped tunnel layer in contact with the p-doped tunnel layer, the n-doped tunnel layer being a n-doped material selected from the group consisting of AlGaAsSb, AlAsSb, AlInAsSb, and AlInPAs;
   wherein the tunnel junction has an InP lattice constant;
   wherein the tunnel junction is optically transparent, forming a heterojunction;
   wherein the p-doped tunnel layer has a bandgap of greater than 1.25 eV and the n-doped tunnel layer has a bandgap of greater than 1.35 eV, the p-doped tunnel layer forming a type-II tunnel junction with the n-doped tunnel layer;
   wherein the tunnel junction is disposed between a first photovoltaic cell and a second photovoltaic cell of the solar cell, the first photovoltaic cell and the second photovoltaic cell each comprising a layer of semiconductor material selected from the group consisting of InP, AlInAsSb, AlInPAs, GaInPAs, GaInAs, AlGaAsSb and GaAsSb, the first photovoltaic cell having a bandgap of from about 1 to 1.1 eV and the second photovoltaic cell having a bandgap of from about 0.73 to about 0.8 eV.

2. The tunnel junction of claim 1, wherein the n-doped tunnel layer is a n-doped material selected from the group consisting of AlAsSb, AlInAsSb, and AlInPAs.

3. The tunnel junction of claim 1, wherein the p-doped tunnel layer and the n-doped tunnel layer have a doping level from $1\times10^{19}$/cm$^3$ to $1\times10^{20}$/cm$^3$.

4. The tunnel junction of claim 1, wherein the p-doped and the n-doped tunnel layers are grown sequentially in a reactor selected from the group consisting of a Metal Organic Vapor Phase Epitaxial reactor, a Hydride Vapor Phase Epitaxial reactor, a Molecular Beam Epitaxy reactor, a Chemical Beam Epitaxy reactor, and an Atomic Layer Deposition reactor.

5. A photonic device, comprising:
   a first photovoltaic cell having a bandgap of from about 1 to 1.1 eV;
   a second photovoltaic cell having a bandgap of from about 0.73 to about 0.8 eV, the first photovoltaic cell and the second photovoltaic cell each comprising a layer of semiconductor material selected from the group consisting of InP, AlInAsSb, AlInPAs, GaInPAs, GaInAs, AlGaAsSb and GaAsSb; and
   a type-II tunnel junction disposed between the first photovoltaic cell and the second photovoltaic cell, the type-II tunnel junction comprising:
      a p-doped tunnel layer comprising AlGaInAs; and
      a n-doped tunnel layer in contact with the p-doped tunnel layer, the n-doped tunnel layer being a n-doped material selected from the group consisting of AlGaAsSb, AlAsSb, AlInAsSb, and AlInPAs;
   wherein the type-II tunnel junction has an InP lattice constant;
   wherein the tunnel junction is optically transparent, forming a heterojunction;
   wherein the p-doped tunnel layer has a bandgap of greater than 1.25 eV and the n-doped tunnel layer has a bandgap of greater than 1.35 eV; and
   further wherein the photonic device is a solar cell.

6. The photonic device of claim 5, wherein the n-doped tunnel layer is a n-doped material selected from the group consisting of AlAsSb, AlInAsSb, and AlInPAs.

7. The photonic device of claim 5, wherein the p-doped tunnel layer and the n-doped tunnel layer have a doping level from $1\times10^{19}/cm^3$ to $1\times10^{20}/cm^3$.

8. The photonic device of claim 5, wherein the photonic device was grown inverted.

9. The photonic device of claim 5, wherein the photonic device was grown upright.

10. The photonic device of claim 5, further comprising:
one or more additional photovoltaic cells in electrical connectivity with the first and second photovoltaic cells.

11. The photonic device of claim 10, wherein the one or more additional photovoltaic cells have a second type-II tunnel junction disposed therebetween, the second type-II tunnel junction comprising:
a p-doped tunnel layer comprising AlGaInAs; and
a n-doped tunnel layer;
wherein the type-II tunnel junction has an InP lattice constant;
wherein the tunnel junction is optically transparent, forming a heterojunction; and
wherein the p-doped tunnel layer has a bandgap of greater than 1.25 eV and the n-doped tunnel layer has a bandgap of greater than 1.35 eV or wherein the p-doped tunnel layer has a bandgap of 0.73-2.0 eV when lattice-matched to the n-doped tunnel layer of InP having a bandgap of 1.35 eV.

12. A method of making a photovoltaic device, comprising: growing a p-doped tunnel layer comprising AlGaInAs; and growing a n-doped tunnel layer in contact with the p-doped tunnel layer, the n-doped tunnel layer being a n-doped material selected from the group consisting of AlGaAsSb, AlAsSb, AlInAsSb, and AlInPAs; wherein the p-doped and n-doped tunnel layers form a high bandgap, type-II tunnel junction having an InP lattice constant,
wherein the tunnel junction is optically transparent, forming a heterojunction;
wherein the p-doped tunnel layer has a bandgap of greater than 1.25 eV and the n-doped tunnel layer has a bandgap of greater than 1.35 eV; and
wherein the tunnel junction is disposed between a first photovoltaic cell and a second photovoltaic cell of the photovoltaic device, the first photovoltaic cell and the second photovoltaic cell each comprising a layer of semiconductor material selected from the group consisting of InP, AlInAsSb, AlInPAs, GaInPAs, GaInAs, AlGaAsSb and GaAsSb, the first photovoltaic cell having a bandgap of from about 1 to 1.1 eV and the second photovoltaic cell having a bandgap of from about 0.73 to about 0.8 eV.

13. The method of claim 12, wherein the p-doped and n-doped tunnel layers are sequentially grown in a reactor selected from the group consisting of a Metalorganic Vapor Phase Epitaxial reactor, a Hydride Vapor Phase Epitaxy reactor, a Molecular Beam Epitaxy reactor, a Chemical Beam Epitaxy reactor, and an Atomic Layer Deposition reactor.

14. The method of claim 12, further comprising: growing two or more photovoltaic cells separated by the high bandgap, type-II tunnel junction.

15. The method of claim 12, wherein the two or more photovoltaic cells are grown upright.

16. The method of claim 12, wherein the two or more photovoltaic cells are grown inverted.

17. A tunnel junction of a solar cell, the tunnel junction comprising:
a p-doped tunnel layer comprising AlGaInAs; and
a n-doped tunnel layer in contact with the p-doped tunnel layer, the n-doped tunnel layer being a n-doped material selected from the group consisting of AlGaAsSb, AlAsSb, AlInAsSb, and AlInPAs;
wherein the tunnel junction has an InP lattice constant;
wherein the tunnel junction is optically transparent, forming a heterojunction;
wherein the tunnel junction is disposed between a first photovoltaic cell and a second photovoltaic cell of the solar cell, the first photovoltaic cell and the second photovoltaic cell each comprising a layer of semiconductor material selected from the group consisting of InP, AlInAsSb, AlInPAs, GaInPAs, GaInAs, AlGaAsSb and GaAsSb, the first photovoltaic cell having a bandgap of from about 1 to 1.1 eV and the second photovoltaic cell having a bandgap of from about 0.73 to about 0.8 eV.

* * * * *